United States Patent
Chen et al.

(10) Patent No.: US 8,389,967 B2
(45) Date of Patent: Mar. 5, 2013

(54) PROGRAMMABLE VIA DEVICES

(75) Inventors: Kuan-Neng Chen, White Plains, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 11/874,582

(22) Filed: Oct. 18, 2007

(65) Prior Publication Data

US 2009/0101882 A1    Apr. 23, 2009

(51) Int. Cl.
*H01L 29/02* (2006.01)
(52) U.S. Cl. .................. 257/2; 257/E31.029; 438/95
(58) Field of Classification Search ....... 257/2, E31.029; 438/95
See application file for complete search history.

(56) References Cited

U.S. PATENT DOCUMENTS

| | | | |
|---|---|---|---|
| 5,635,893 A * | 6/1997 | Spraggins et al. | 338/48 |
| 6,348,365 B1 * | 2/2002 | Moore et al. | 438/130 |
| 2004/0130029 A1 * | 7/2004 | Raaijmakers et al. | 257/758 |
| 2006/0073652 A1 * | 4/2006 | Pellizzer et al. | 438/201 |
| 2006/0133174 A1 * | 6/2006 | Kim et al. | 365/222 |
| 2007/0235708 A1 | 10/2007 | Elmegreen et al. | |
| 2007/0298535 A1 * | 12/2007 | Lung | 438/102 |
| 2008/0197334 A1 * | 8/2008 | Lung | 257/2 |
| 2008/0246014 A1 * | 10/2008 | Lung | 257/4 |
| 2008/0277641 A1 * | 11/2008 | Stanton | 257/4 |
| 2009/0003045 A1 * | 1/2009 | Chen | 365/163 |
| 2009/0166600 A1 * | 7/2009 | Park et al. | 257/3 |

OTHER PUBLICATIONS

U.S. Appl. No. 11/612,631, filed Dec. 19, 2006 and entitled "Programmable Via Structure and Method of Fabricating Same."

* cited by examiner

*Primary Examiner* — Thao Le
*Assistant Examiner* — Matthew Gordon
(74) *Attorney, Agent, or Firm* — Vazken Alexanian; Ryan, Mason & Lewis, LLP

(57) ABSTRACT

A device comprises a heater, a dielectric layer, a phase-change element, and a capping layer. The dielectric layer is disposed at least partially on the heater and defines an opening having a lower portion and an upper portion. The phase-change element occupies the lower portion of the opening and is in thermal contact with the heater. The capping layer overlies the phase-change element and occupies the upper portion of the opening. At least a fraction of the phase-change element is operative to change between lower and higher electrical resistance states in response to an application of an electrical signal to the heater.

19 Claims, 4 Drawing Sheets

PROGRAMMABLE VIA DEVICES

FIELD OF THE INVENTION

The present invention is directed to integrated circuits, and, more particularly, to programmable via devices in integrated circuits.

BACKGROUND OF THE INVENTION

Reconfigurable circuits have been widely used in the semiconductor industry for field programmable gate arrays (FPGAs) and for the repair of defective memory elements. Moreover, reconfigurable circuits such as FPGAs are also anticipated to play a significant role in the new Three Dimensional Integration (3DI) technology currently under development. 3DI structures typically include multilayer structures that can form a single chip combination with different functionalities. In these multilayer (and multifunctional) systems, reconfigurable circuit connections are needed to provide controllable logic functionality, memory repair, data encryption, as well as other functions.

A programmable via device (PVD) is an enabling technology for high-performance reconfigurable logic applications such as those required for 3DI applications. As the name would suggest, a PVD comprises vias (i.e., vertical contacts) whose resistance can be temporarily or permanently switched (i.e., programmed) between two or more resistance states by applying one or more signals to the device. Recently, the possibility of using phase change materials (PCMs) in PVDs has gained momentum as more is learned about these materials and their integration into integrated circuits. Currently, a ternary alloy of germanium (Ge), antimony (Sb), and tellurium (Te) (GST) (e.g., $Ge_2Sb_2Te_5$) is showing the greatest promise for use in practical PCM-based PVDs, although several other materials are presently under investigation. At room temperature and at moderately elevated temperatures, for example, GST is stable in two phases, a crystalline phase, which is a moderately good conductor of electrical current, and an amorphous phase, which is largely insulating. The GST in a PVD may be converted between these phases by applying a pulse of current ("switching current pulse") to a heating feature that is located proximate to the GST. This switching current pulse, in turn, acts to resistively heat the heating feature and, as a result, the adjacent GST. A RESET switching current pulse is designed to rapidly heat the GST above its melting point and then to rapidly quench the melted material so that its disordered arrangement of atoms is retained. In this manner, the RESET switching current pulse converts at least a fraction of the GST from a crystalline phase to an amorphous phase. In contrast, a SET switching current pulse is designed to anneal the GST at temperatures below its melting point for a time somewhat longer than the RESET pulse. Such a SET switching pulse converts at least a fraction of the GST from the amorphous phase into the crystalline phase.

Several designs and methods of forming PCM-based PVDs are described in, for example, U.S. Patent Publication No. 2007/0235708 A1, entitled "Programmable via structure for three dimensional integration technology," and U.S. patent application Ser. No. 11/612,631, entitled "Programmable via structure and method of fabricating same," which are commonly assigned herewith and are incorporated by reference herein. Nevertheless, despite their promise for use in reconfigurable circuits, there remains a need for refined designs and fabrication techniques for PCM-based PVDs. Ideally such designs and fabrication techniques will be compatible with conventional complimentary-metal-oxide-semiconductor (CMOS) processing.

SUMMARY OF THE INVENTION

Embodiments of the present invention address the above-identified need by providing designs and methods of fabricating PCM-based PVDS that are compatible with conventional CMOS processing.

In accordance with an aspect of the invention, a device comprises a heater, a dielectric layer, a phase-change element, and a capping layer. The dielectric layer is disposed at least partially on the heater and defines an opening having a lower portion and an upper portion. The phase-change element occupies the lower portion of the opening and is in thermal contact with the heater. The capping layer overlies the phase-change element and occupies the upper portion of the opening. At least a fraction of the phase-change element is operative to change between lower and higher electrical resistance states in response to an application of an electrical signal to the heater.

In accordance with one of the above-identified embodiments of the invention, a programmable via device comprises a dielectric layer partially disposed on a heater. A PCM element occupies a lower portion of an opening in the dielectric layer, while a capping layer overlies the PCM element and occupies an upper portion of the opening. The PCM element is recessed into the opening in this manner by a polishing process (e.g., chemical mechanical polishing). Suitable signals applied to the heater act to cause the heater to heat the PCM element and to cause the PCM element to change between crystalline and amorphous phases. The capping layer acts as a diffusion barrier between the PCM element and overlying metallic features.

These and other features and advantages of the present invention will become apparent from the following detailed description which is to be read in conjunction with the accompanying drawings.

DETAILED DESCRIPTION OF THE INVENTION

This invention will be illustrated herein in conjunction with an exemplary PVD for use in integrated circuits and methods for forming such a PVD. Such a device may be used in a range of applications including, but not limited to, reconfigurable circuits. It should be understood, however, that the invention is not limited to the particular materials, features, and processing steps shown and described herein. Modifications to the illustrative embodiments will be apparent to those skilled in the art.

Particularly with respect to processing steps, it is emphasized that the descriptions provided herein are not intended to encompass all of the processing steps that may be required to successfully form a functional device in an integrated circuit. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description. Moreover, details of conventional semiconductor processing steps described herein will only be described generally since the details of these conventional processes will be known to one skilled in the art and since there are commercially available semiconductor processing tools for implementing these processing steps. Details of the processing steps used to fabricate semiconductor devices may be found in a number of publications, for example, S. Wolf and R. N. Tauber, *Silicon Processing for the VLSI Era, Volume* 1, Lattice Press, 1986; and S. Wolf, *Silicon Processing for the VLSI Era, Volume* 4: *Deep Submicron Process Technology*, Lattice Press, 2002, both of which are incorporated herein by reference.

The term "phase change material" (PCM) as used herein is intended to encompass any material displaying more than one programmable electrical resistance state for use in integrated circuits. PCMs comprise, for example, various chalcogenides and transition metal oxides and include, but are not limited to, doped or undoped $Ge_2Sb_2Te_5$, GeSb, $GeSb_4$, SbTe, $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, $NiO_x$ and $TiO_x$, as well as other suitable materials.

It should also be understood that the various layers and/or regions shown in the accompanying figures are not drawn to scale, and that one or more layers and/or regions of a type commonly used in integrated circuits may not be explicitly shown in a given figure. This does not imply that the layers and/or regions not explicitly shown are omitted from the actual integrated circuit.

Figure 1:
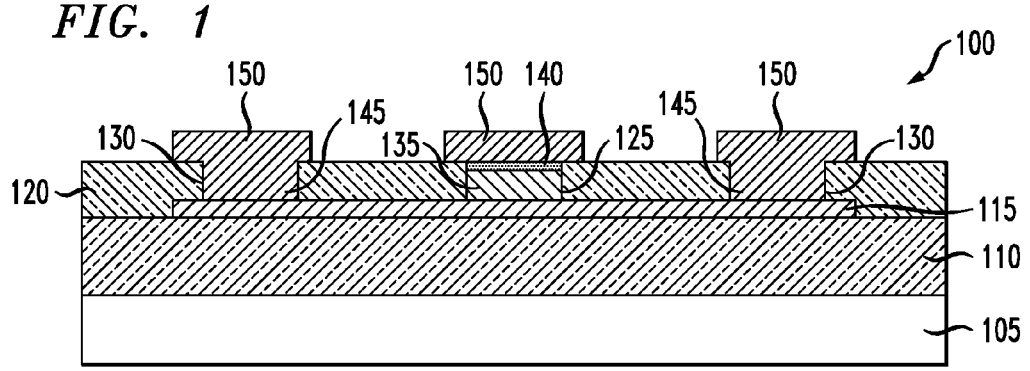
FIG. 1 shows a sectional view of a programmable via device in accordance with an illustrative embodiment of the invention.

FIG. 1 shows a PVD 100 in accordance with an illustrative embodiment of the invention. This illustrative PVD comprises a substrate 105, a lower dielectric layer 110, a heater 115, and an upper dielectric layer 120. The upper dielectric layer comprises a first opening 125 and two second openings 130. A PCM element 135 and a capping layer 140 occupy the first opening, while metal vias 145 occupy the second openings. Metal lines 150 are disposed on the metal vias and on the capping layer.

In the illustrative PVD 100, the substrate preferably comprises silicon or some other suitable semiconductor material, while the lower dielectric layer 110 and upper dielectric layer 120 preferably comprise silicon oxide (e.g., $SiO_x$) or some other suitable dielectric material such as silicon nitride (e.g., $Si_xN_y$); silicon carbonitride (e.g., $SiC_xN_y$); silicon-carbon hydroxide (e.g., SiCOH); or silicon oxynitride (e.g., $SiO_xN_y$). Moreover, the heater 115 preferably comprises tantalum silicon nitride (e.g., $Ta_xSi_yN_z$) or some other suitable conductive material with a relatively high resistivity (e.g., from about 100 ohm-cm to about 1,000 ohm-cm) such as, but not limited to, tantalum nitride (e.g., TaN), chromium oxide (e.g., $CrO_x$), or ruthenium oxide (e.g., $RuO_x$). The PCM element 135 preferably comprises GST or some other suitable PCM (further described above), while the metal vias 145 and metal lines 150 preferably comprise a conductive metallic material such as tungsten, copper, aluminum, or alloys thereof.

The material for the capping layer 140 is preferably chosen so that the capping layer acts as a diffusion barrier between the PCM element 135 and the overlying metal line 150. The capping layer may, for example, comprise a layer of titanium nitride (e.g., TiN) deposited on a thin layer (e.g., less than about one nanometer) of titanium or a layer of tantalum nitride (e.g., TaN) deposited on a thin layer of tantalum. The purely metallic sublayers typically act as adhesion layers for the metal nitride sublayers. The metal nitride sublayers typically act as the diffusion barriers.

In all cases, however, it should be noted that the above-described choices of materials for the elements in the PVD 100 are merely illustrative and that other suitable materials may be utilized as substitutes for the ones explicitly presented herein. Embodiments comprising such alternative materials will be apparent to one skilled in the art and may still fall within the scope of the invention.

The PVD 100 is programmable between two resistance states by applying a switching current pulse between the metal lines 150 contacting the metal vias 145. Such a signal application causes the switching current pulse to pass through the heater 115 where it is partially converted into heat by resistive (i.e., ohmic) heating. This, in turn, causes the adjacent PCM element 135 to be heated by conduction. A RESET switching current pulse is applied to the PVD in order to rapidly melt and quench the PCM element and to thereby convert at least a fraction of the PCM from its moderately conductive crystalline phase to its insulating amorphous phase. A RESET pulse may, as an example, ramp up to peak current in about ten nanoseconds (ns), stay at peak current for 50 ns, and ramp down in two ns. A SET switching current pulse is, in contrast, applied to the PVD in order to anneal the PCM element below its melting point and to convert at least a fraction of the PCM from its amorphous phase into its crystalline phase. A SET switching pulse may, for example, ramp up to peak current in about ten ns, stay at peak current for about 1,000 ns, and ramp down in about 200 ns. In this manner, the PVD may be cycled between resistance states.

After being so programmed, any signals applied to the PVD 100 that must travel through the PCM element 135 will be affected by the PVD's programmed state. The resistance of a PVD after a suitable SET switching current pulse may be more than three orders of magnitude higher than the resistance after a suitable RESET switching current pulse.

Figure 2:
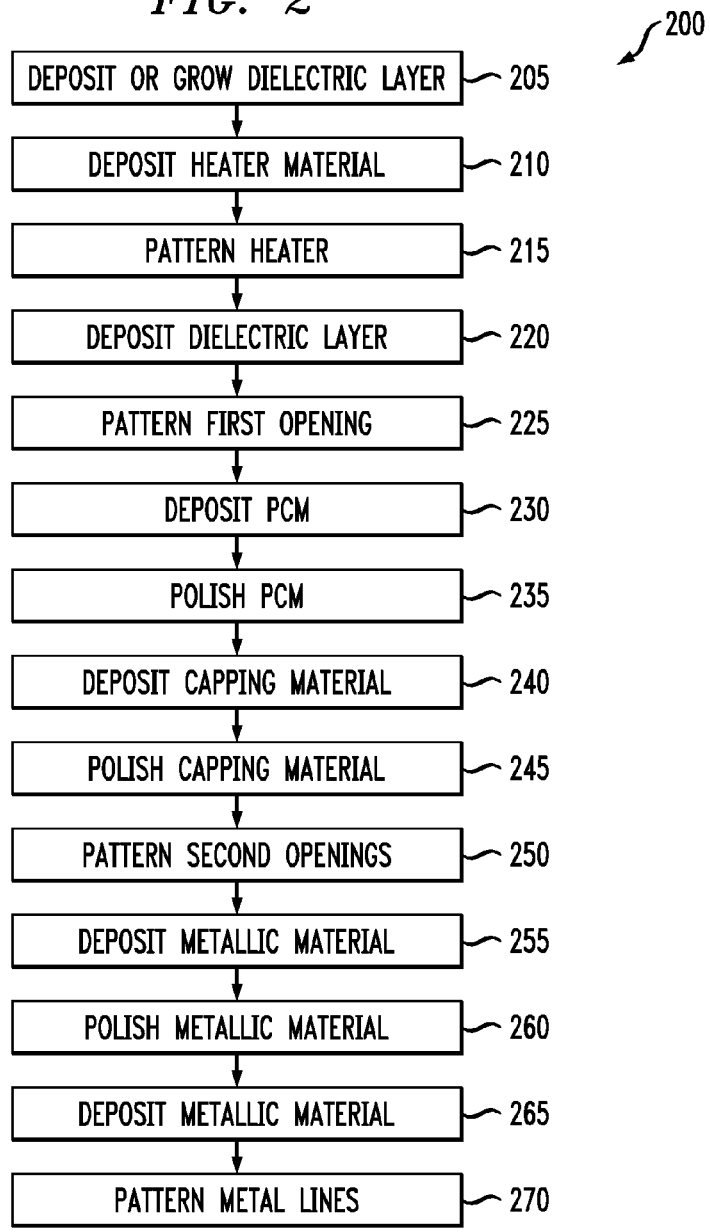
FIG. 2 shows a flow chart of an illustrative method of forming the FIG. 1 programmable via device.

FIG. 2 shows a flow chart of an illustrative method 200 in accordance with aspects of the invention for forming the PVD 100. Moreover, FIGS. 3A-3J show sectional views of the PVD in various stages of formation using this illustrative method.

Figure 3A:
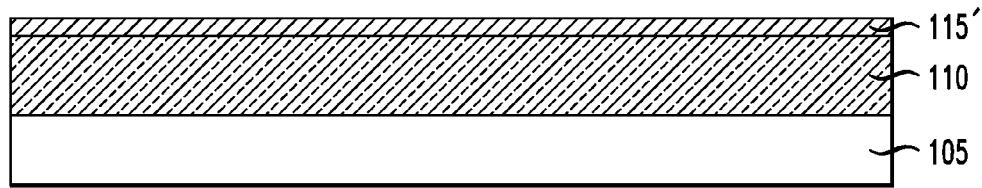
FIGS. 3A-3J show sectional views of the FIG. 1 programmable via device in various stages of formation using the FIG. 2 method.
Figure 3B:
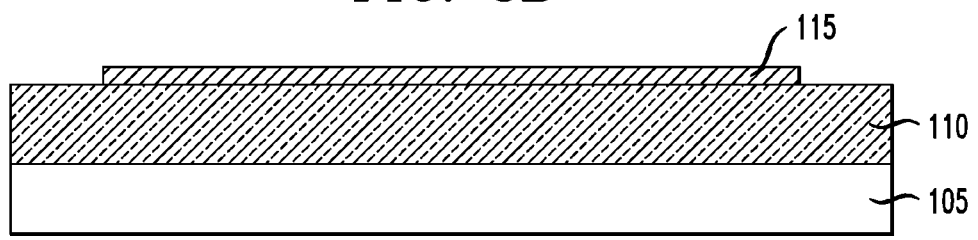

In step 205 of the method 200, a dielectric layer is grown or deposited on the substrate 105 to form the lower dielectric layer 110. If the lower dielectric layer comprises silicon oxide, for example, it may be thermally grown on a silicon substrate. Next, in step 210, a layer of heater material 115' for the heater 115 is deposited on the lower dielectric layer, as shown in FIG. 3A. In step 215, the layer of heater material is patterned such that it forms the discrete heater, as shown in FIG. 3B.

Figure 3C:
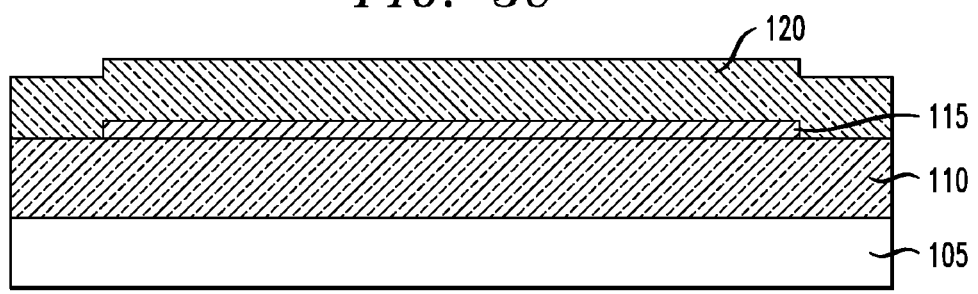
Figure 3D:
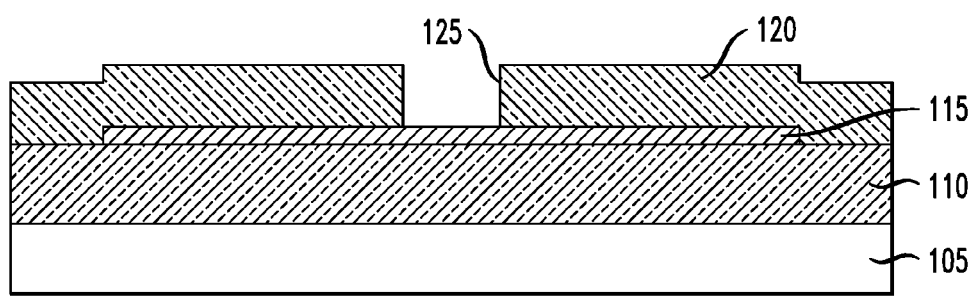

In step 220, a layer of dielectric material is deposited on the film stack to form the upper dielectric layer 120, as shown in FIG. 3C. Subsequently, in step 225, the first opening 125 is patterned into the upper dielectric layer. The first opening lands on the heater 115, as shown in FIG. 3D.

Figure 3E:
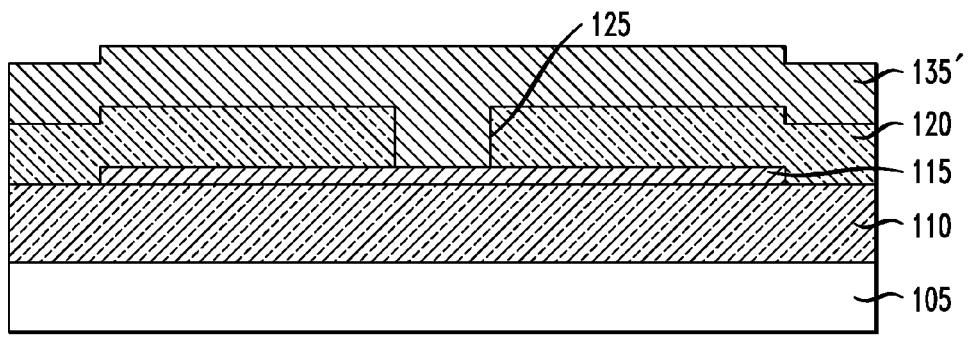

In step 230, a layer of PCM 135' for the PCM element 135 is conformally deposited onto the uppermost surface of the upper dielectric layer 120 and into the first opening 125. The layer of PCM fills the entire first opening, as shown in FIG. 3E.

Figure 3F:
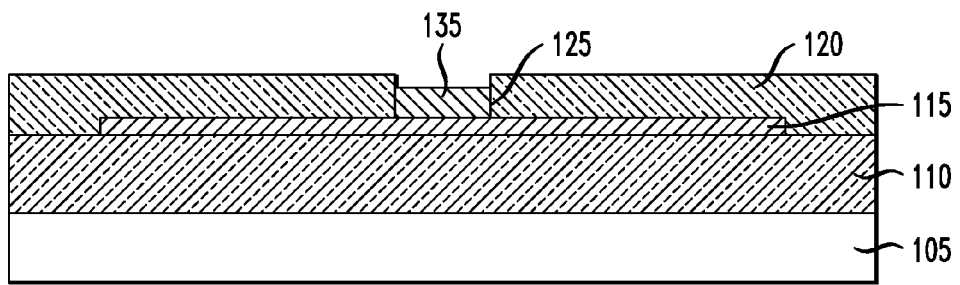
Figure 3G:
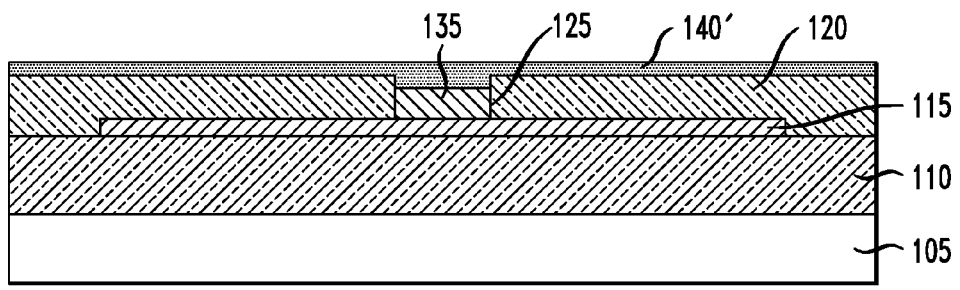

In step 235, the layer of PCM 135' is polished such that it is entirely removed from the uppermost surface of the upper dielectric layer 120. The uppermost surface is also polished somewhat by this process. Moreover, in accordance with aspects of the invention, the polishing process is allowed to recess the PCM into the first opening 125 such that the PCM element 135 is defined, as shown in FIG. 3F. One will note that, as a result of this polishing process, the PCM element only occupies a lower portion of the first opening. In other words, the PCM is purposefully removed from the upper portion of the first opening.

The just-described polishing process may comprise chemical-mechanical polishing (CMP). This CMP process is designed to take advantage of the softness of the PCM in relation to upper dielectric layer 120, effectively allowing the PCM element 135 to be recessed into the first opening 125. Such a CMP process will be familiar to one skilled in the art.

Figure 3H:
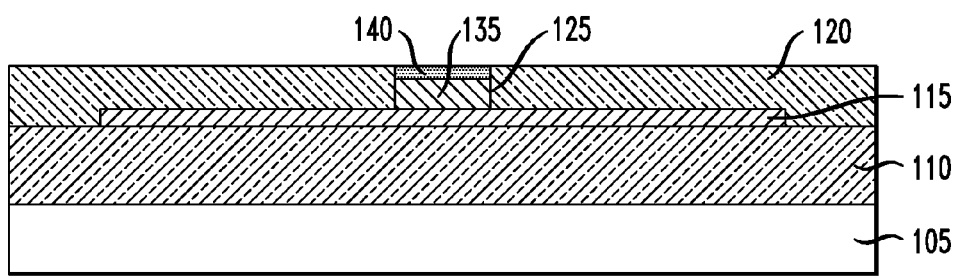

Subsequently, in step 240 of the method 200, a layer of capping material 140' for the capping layer 140 is conformally deposited on the uppermost surface of the upper dielectric layer 120 and into the upper portion of the first opening 125 so that it overlies the PCM element 135. In step 245, this layer of capping material is polished so that it is removed from the uppermost surface of the dielectric layer. This leaves the discrete capping layer in the upper portion of the first opening, as shown in FIG. 3H. As indicated in the figure, the capping layer has an uppermost surface that is substantially coplanar with the uppermost surface of the upper dielectric layer.

Figure 3I:
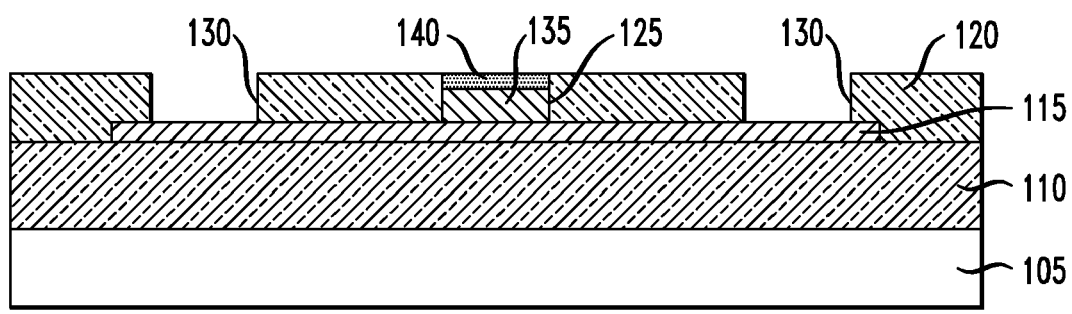
Figure 3J:
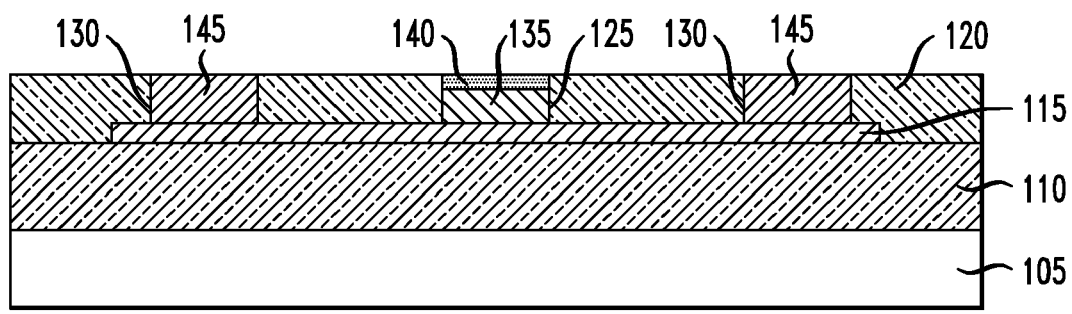

In step 250, the second openings 130 are patterned into the upper dielectric layer 120. The second openings also land on the heater 115, as shown in FIG. 3I. In step 255, a first layer of metallic material for the metal vias 145 is conformally deposited on the uppermost surface of the upper dielectric layer, onto the capping layer 140, and into the second openings. In step 260, this metallic material is then be polished such that it only remains in the second openings, thereby forming the metal vias 145, as shown in FIG. 3J. Subsequently, in step 265, a second layer of metallic material is deposited on the film stack. In step 270, this second layer of metallic material is patterned to form the metal lines 150. After completing these processing steps, the PVD 100 is formed as shown in FIG. 1.

Advantageously, the PVD 100 and the method 200 are compatible with conventional CMOS processing. That is, they do not require processing steps that are not conventionally used in modern CMOS processing. What is more, methods in accordance with aspects of the invention may have several advantages when compared to other processing techniques for PCM-based PVDs. As described above with reference to steps 235-245, for example, the capping layer 140 in the method 200 is formed by the steps of: recessing the PCM element 135 by polishing such that it only occupies the lower portion of the first opening 125 in the upper dielectric layer 120, depositing a layer of capping material 140' on the film stack, and then polishing the capping material such that it only remains in the upper portion of the first opening. As a result, the processing sequence used to form the capping layer does not use a purpose-specific photolithography step and is likely to be significantly less expensive than a processing sequence that forms the capping layer by depositing the layer of capping material and then using photolithography and anisotropic etching to pattern the layer of capping material. Steps comprising photolithography are typically among the most expensive steps in a given semiconductor processing scheme.

Moreover, the ability to form the metal vias 145 by depositing a layer of metallic material into the second openings 130 and polishing the metallic material, as described above with reference to steps 255 and 260, is facilitated by the fact that the capping layer 140 does not protrude above the uppermost surface of the upper dielectric layer 120. If the capping layer were to protrude in this manner, it would be difficult to remove the metallic material completely from the uppermost surface of the upper dielectric layer by polishing since the protruding capping layer would interfere with this polishing or be damaged by this processing step.

The method 200 also allows the metal vias 145 to be formed after forming the PCM element 135 and the capping layer 140. This sequence mitigates cross-contamination issues. It is widely recognized, for example, that the presence of certain metallic materials for the metal vias such as copper during the deposition of GST may adversely affect the physical properties of the GST. With the fabrication sequence provided herein, the PCM element is already formed and encapsulated before any metallic material for the metal vias is deposited.

Devices and fabrication methods in accordance with aspects of the invention may be utilized to form an integrated circuit. The integrated circuit design is created in a graphical computer programming language, and is stored in a computer storage medium (such as a disk, tape, physical hard drive, or virtual hard drive such as in a storage access network). If the designer does not fabricate integrated circuits or photolithographic masks used to fabricate integrated circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the integrated circuit design in question that are formed on a wafer. The photolithographic masks are utilized to define areas of the wafer (and/or the layers thereon) to be etched or otherwise processed.

The resulting integrated circuits may be distributed by the fabricator in raw wafer form (i.e., as a single wafer that has multiple unpackaged integrated circuits), as a bare die, or in packaged form. In the latter case, the integrated circuit is mounted in a single integrated circuit package (e.g., plastic carrier with leads that are affixed to a motherboard or other higher level carrier) or in a multi-integrated circuit package (e.g., ceramic carrier that has either or both surface interconnections or buried interconnections). In any case, the integrated circuit is then integrated with other chips, discrete circuit elements, and/or other signal processing devices as part of either an intermediate product (e.g., motherboard) or an end product. The end product may be any product that includes integrated circuits, ranging from toys and other low-end applications to advanced computer products having a display, a keyboard or other input device, and a central processor.

Although illustrative embodiments of the present invention have been described herein with reference to the accompanying figures, it is to be understood that the invention is not limited to those precise embodiments, and that various other changes and modifications may be made to these embodiments by one skilled in the art without departing from the scope of the appended claims.

What is claimed is:
1. A device comprising:
   heater;
   a dielectric layer disposed at least partially overlaying the heater, the dielectric layer comprising a first opening and a second opening, the first and second openings formed completely through the dielectric layer down to the heater, the first opening having a lower portion and an uppermost portion;
   a phase-change element at least mostly filling the lower portion of the first opening and in thermal contact with the heater;

a diffusion barrier layer overlying the phase-change element and at least mostly filling the uppermost portion of the first opening; and a conductive via formed in the second opening of the dielectric layer in contact with the heater, wherein at least a fraction of the phase-change element is operative to change between lower and higher electrical resistance states in response to an application of an electrical signal to the heater.

2. The device of claim 1, wherein the heater comprises at least one of tantalum, chromium, and ruthenium.

3. The device of claim 1, wherein the dielectric layer comprises at least one of silicon oxide, silicon carbonitride, and silicon nitride.

4. The device of claim 1, wherein the phase-change element comprises at least one of germanium, antimony, and tellurium.

5. The device of claim 1, wherein the diffusion barrier layer has an uppermost surface that is substantially coplanar with an uppermost surface of the dielectric layer.

6. The device of claim 1, wherein the diffusion barrier layer comprises at least one of titanium and tantalum.

7. The device of claim 1, wherein the diffusion barrier layer comprises at least one of titanium nitride and tantalum nitride.

8. The device of claim 1, further comprising a second conductive via formed in a third opening of the dielectric layer in contact with the heater, wherein the conductive via and the second conductive via are operative to apply the electrical signal to the heater.

9. The device of claim 1, further comprising a metallic feature formed at least partially on the diffusion barrier layer.

10. The device of claim 9, wherein the diffusion barrier layer acts as a diffusion barrier between the phase-change element and the metallic feature.

11. The device of claim 9, wherein the metallic feature comprises at least one of tungsten, copper, and aluminum.

12. An integrated circuit comprising:
a heater;
a dielectric layer disposed at least partially overlaying the heater, the dielectric layer comprising a first opening and a second opening, the first and second openings formed completely through the dielectric layer down to the heater, the first opening having a lower portion and an uppermost portion;

a phase-change element at least mostly filling the lower portion of the first opening and in thermal contact with the heater;

a diffusion barrier layer overlying the phase-change element and at least mostly filling the uppermost portion of the first opening; and a conductive via formed in the second opening of the dielectric layer in contact with the heater, wherein at least a fraction of the phase-change element is operative to change between lower and higher electrical resistance states in response to an application of an electrical signal to the heater.

13. The integrated circuit of claim 12, further comprising a programmable via device.

14. The integrated circuit of claim 12, further comprising a reconfigurable circuit.

15. The device of claim 1, wherein the dielectric layer is substantially continuous between the first and second openings and the conductive via.

16. The device of claim 1, wherein the diffusion barrier layer comprises a metal nitride sublayer disposed on a substantially metallic sublayer.

17. The device of claim 16, wherein the metal nitride sublayer comprises titanium nitride and the substantially metallic sublayer comprises titanium.

18. The device of claim 16, wherein the metal nitride sublayer comprises tantalum nitride and the substantially metallic sublayer comprises tantalum.

19. The device of claim 16, wherein the substantially metallic sublayer has a thickness of less than about one nanometer.

\* \* \* \* \*